United States Patent
Reshotko et al.

(10) Patent No.: US 10,665,499 B2
(45) Date of Patent: May 26, 2020

(54) INTEGRATED CIRCUIT WITH AIRGAPS TO CONTROL CAPACITANCE

(71) Applicant: Intel Corporation, Santa Clara, CA (US)

(72) Inventors: Miriam R. Reshotko, Portland, OR (US); Nafees A. Kabir, Portland, OR (US); Manish Chandhok, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/021,352

(22) Filed: Jun. 28, 2018

(65) Prior Publication Data

US 2020/0006115 A1 Jan. 2, 2020

(51) Int. Cl.
| | |
|---|---|
| *H01L 21/768* | (2006.01) |
| *H01L 21/311* | (2006.01) |
| *H01L 23/532* | (2006.01) |
| *H01L 23/522* | (2006.01) |
| *H01L 23/482* | (2006.01) |

(52) U.S. Cl.
CPC .... *H01L 21/7682* (2013.01); *H01L 21/31116* (2013.01); *H01L 23/5226* (2013.01); *H01L 23/5329* (2013.01); *H01L 23/4821* (2013.01); *H01L 2221/1042* (2013.01)

(58) Field of Classification Search
CPC ............. H01L 21/7682; H01L 23/4821; H01L 2221/1042
See application file for complete search history.

(56) References Cited

U.S. PATENT DOCUMENTS

| | | | |
|---|---|---|---|
| 6,287,979 B1 * | 9/2001 | Zhou ...................... | B82Y 10/00 438/723 |
| 7,705,392 B2 * | 4/2010 | Yonemochi ......... | H01L 21/7682 257/315 |

(Continued)

OTHER PUBLICATIONS

Williams et al, "Etch Rates for Micromachining Processing—Part II", Journal of Microelectromechanical Systems, Dec. 2003, pp. 761-778, vol. 12, No. 6, Institute of Electrical and Electronics Engineers.

(Continued)

*Primary Examiner* — David A Zarneke
(74) *Attorney, Agent, or Firm* — Trop, Pruner & Hu, P.C.

(57) ABSTRACT

An embodiment includes first, second, and third metal layers; first, second, and third metal lines included in the second metal layer; a layer including airgaps, the first metal layer being between the layer including airgaps and the second metal layer; a first void between the first and second metal lines and a second void between the second and third metal lines; a conformal layer between the first and second metal lines; an additional layer between the first and second metal layers; wherein the first void includes air and the second void includes air; wherein a first axis intersects the first, second, and third metal lines and the first and second voids; wherein a second axis, orthogonal to the first axis, intersects the conformal layer and the additional layer; wherein a third axis, orthogonal to the first axis, intersects the second metal line and the additional layer.

23 Claims, 8 Drawing Sheets

(56) References Cited

U.S. PATENT DOCUMENTS

| | | | | |
|---|---|---|---|---|
| 7,807,563 B2* | 10/2010 | Gabric | ............... | H01L 21/7682 |
| | | | | 257/640 |
| 8,129,264 B2* | 3/2012 | Kim | ............... | C23C 16/402 |
| | | | | 438/619 |
| 8,456,009 B2* | 6/2013 | Su | ............... | H01L 21/7682 |
| | | | | 257/764 |
| 8,946,048 B2* | 2/2015 | Purayath | ............... | H01L 21/764 |
| | | | | 438/421 |
| 9,123,727 B2 | 9/2015 | Fischer | | |
| 9,837,305 B1* | 12/2017 | Briggs | ............... | H01L 21/7682 |
| 9,892,961 B1* | 2/2018 | Cheng | ............... | H01L 21/02126 |
| 10,062,609 B2* | 8/2018 | You | ............... | H01L 21/76802 |
| 10,163,792 B2* | 12/2018 | Zhu | ............... | H01L 21/76831 |
| 2009/0093100 A1* | 4/2009 | Xia | ............... | C23C 16/325 |
| | | | | 438/421 |
| 2013/0207267 A1* | 8/2013 | Rho, II | ............... | H01L 21/324 |
| | | | | 257/751 |
| 2015/0137378 A1* | 5/2015 | Wu | ............... | H01L 23/5222 |
| | | | | 257/773 |
| 2015/0262860 A1* | 9/2015 | Kao | ............... | H01L 21/7682 |
| | | | | 257/774 |
| 2018/0130697 A1* | 5/2018 | Jang | ............... | H01L 23/53295 |
| 2018/0204759 A1* | 7/2018 | Bruce | ............... | H01L 23/53295 |
| 2019/0181033 A1* | 6/2019 | Penny | ............... | H01L 21/76831 |

OTHER PUBLICATIONS

Khan et al., "Damascene Process and Chemical Mechanical Planarization", http://www.ece.umd.edu/class/enee416/GroupActivities/Damascene%20Presentation.pdf, accessed Jun. 14, 2018.

* cited by examiner

INTEGRATED CIRCUIT WITH AIRGAPS TO CONTROL CAPACITANCE

TECHNICAL FIELD

Embodiments of the invention are in the field of semiconductor devices and, in particular, interconnects.

BACKGROUND

Once semiconductor wafers are prepared, a large number of process steps are still necessary to produce desired semiconductor integrated circuits. In general the steps can be grouped into four areas: Front End Processing, Back End Processing, Test, and Packaging.

Front End Processing (sometimes referred to as "frontend") refers to the initial steps in the fabrication. In this stage the actual semiconductor devices (e.g., transistors) are created. A typical front end process includes: preparation of the wafer surface, patterning and subsequent implantation of dopants to obtain desired electrical properties, growth or deposition of a gate dielectric, and growth or deposition of insulating materials to isolate neighboring devices.

Once the semiconductor devices have been created they must be interconnected to form the desired electrical circuits. This "Back End Processing" (sometimes referred to as "backend") involves depositing various layers of metal and insulating material in the desired pattern. Typically the metal layers consist of aluminum, copper, and the like. The insulating material may include oxides, low-K materials, and the like. The various metal layers are interconnected by interconnects, which may include a line portion (sometimes referred to as a trace or wire) and a via portion. Vias may be formed by etching holes in the insulating material and depositing metal (e.g., Tungsten) in them. The line portion may be formed by etching trenches in the insulating material and depositing metal in them.

Once the Back End Processing has been completed, the semiconductor devices are subjected to a variety of electrical tests to determine if they function properly. Finally, the wafer is cut into individual die, which are then packaged in packages (e.g., ceramic or plastic packages) with pins or other connectors to other circuits, power sources, and the like.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

DETAILED DESCRIPTION

Figure 1A:
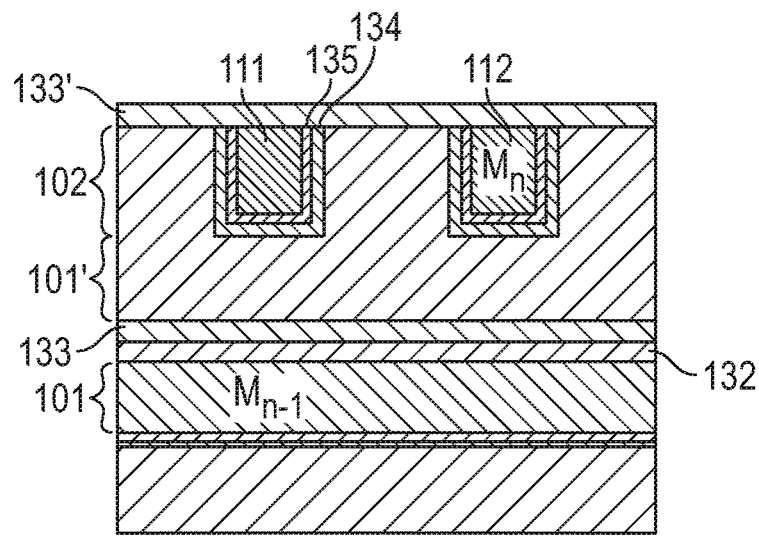
FIGS. 1A-1G depicts an embodiment of a process for forming deep airgaps in an integrated circuit (IC).

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated IC structures, for example in a photomicrograph, may appear different while still incorporating the claimed structures of the illustrated embodiments (e.g., walls may not be exactly orthogonal to one another in actual fabricated devices). Moreover, the drawings may only show the structures useful to understand the illustrated embodiments. Additional structures known in the art may not have been included to maintain the clarity of the drawings. For example, not every layer (e.g., barrier layer, seed layer, etch stop layer) of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

As addressed in U.S. Pat. No. 9,123,727 (assigned to Intel Corporation, Santa Clara, Calif., U.S.A.) ICs are becoming more complex with components becoming more densely packed as those circuits become smaller, operate faster, and attempt to consume less energy.

As mentioned above, IC components are connected by conductive traces and vias (collectively referred to as "interconnects") through which electrical signals are sent and/or received. Interconnects are typically formed through a damascene process. The material surrounding the interconnects electrically insulates each interconnect from neighboring interconnects. However, the dielectric properties of the material surrounding the interconnects enables capacitive coupling between adjacent interconnects, which increases chip power requirements and interferes with signal transmission.

As device dimensions decrease, interconnect dimensions and spacing also decrease, which results in increased current density and resistance along with a greater risk of electromigration, capacitive coupling and resistive-capacitive (RC) delay. Furthermore, interconnect material may diffuse into the surrounding dielectric material, reducing the dielectric insulating capacity and enabling crosstalk between adjacent interconnects and components. While diffusion and electromigration may be controlled by encapsulating the interconnect with a barrier layer, the additional barrier material may increase the resistance and dimensions of the interconnect.

U.S. Pat. No. 9,123,727 addressed capacitive coupling by incorporating an airgap between neighboring interconnects. Air has an extremely low dielectric constant (about 1, compared to about 4 for silicon dioxide), and therefore more effectively isolates adjacent interconnects than solid dielectric materials. While Applicant's inclusion of airgaps has helped addressed capacitive coupling, Applicant has determined several issues remain with airgaps.

First, Applicant determined the airgaps are unable to delivery their maximum capacitive damping because of their relatively shallow depth. More specifically, in the back end of an IC the airgap may be formed between two metal lines to limit crosstalk and the like between those two lines. However, the airgap fails to extend deeply into the dielectric layer immediately below the metal lines. This dielectric layer is where vias are formed (so vias can connect either or both of the above mentioned lines with a metal layer below those metal lines). The airgap fails to extend deeply into this dielectric layer to accommodate fears that an aggressive etch (used to form the airgaps) may extend too far and go through the dielectric layer and into the underlying metal layer. Such an over etch would adversely affect the performance of the underlying metal layer and the IC in general.

Second, Applicant determined etch rates vary with feature density and wafer location. More specifically, an IC metal layer may have two metal lines separated by a relatively wide width and another two metal lines separated by a relatively narrow width. The etch used to form airgaps between these lines may etch more deeply between the widely spaced lines and less deeply between the narrowly spaced lines. The inconsistent depth of the airgaps can pose problems with reliably controlling capacitive coupling.

Third, Applicant determined the above mentioned first and second problems build upon each other. For instance, the inconsistent etch depths issues (brought on by varying component densities) make manufacturers hesitant to etch deeply into the dielectric layer below the metal lines due to a fear of over etching in less densely populated areas of the IC. While masks can be used to shield etching of the less densely populated areas of the IC, those masks are expensive, add time and complications to the IC formation process, and reduce the use airgaps. Thus, the number of airgaps used may decrease and the depth of the airgaps may be shallow—all of which decreases the control over capacitive coupling in the IC.

To address these shortcomings, embodiments provide a robust high selectivity etch stop layer located between (a) an underlying metal layer, and (b) the metal and via layers (which include airgaps) that are above the underlying metal layer. The robust etch stop layer allows for uniform and deeper etches that produce larger airgaps (which more effectively address capacitive coupling) without over etching into non-targeted underlying layers. Further, such a robust etch stop layer allows areas with low component densities to be etched to the same depth as areas with higher component densities. This avoids the masks used to prevent etching of the low component density areas and, consequently, allows for more airgaps that reduce capacitance. By increasing the depth of airgaps and implementing airgaps in low component density areas, capacitance benefits of between 10 and 40% can be achieved.

FIGS. 1A-1G depict an embodiment of a process for forming deep airgaps in an IC.

FIG. 1A entails forming (a) a first metal layer 101 on a layer of transistors (not shown); (b) an additional layer 132 on the first metal layer 101; (c) a first dielectric layer 101' on the additional layer 132; and (d) first and second metal lines 111, 112 in a second metal layer 102.

The additional layer 132 may include a robust etch stop layer used to control the depth of airgap etching. For example, layer 132 may include a metal oxide such as aluminum oxide, hafnium oxide, or combinations thereof. Such a layer may allow for etch selectivity of the dielectric of layer 101'. For example, when layer 101' includes silicon oxide and layer 132 includes aluminum oxide, the etchant (e.g., a dry etch fluorocarbon such as $CF_4$ or some other etchant such as $SF_6$) of the silicon oxide may have a selectivity of 20:1 or greater (where selectivity=(etch rate (nm/min) of silicon oxide with etchant/etch rate (nm/min) of aluminum oxide with the same etchant)).

As is the case in many parts of this description, focus in FIG. 1A is maintained on certain interconnects and airgaps. The number of layers that may or may not be part of an embodiment are many and labeling of every such combination would complicate the description of the airgaps. Thus, etch stop layers 133, 133' may be included in some embodiments. Barrier and/or adhesive layers (e.g., layers 134, 135) may also exist as is common with metal line formation.

Figure 1B:
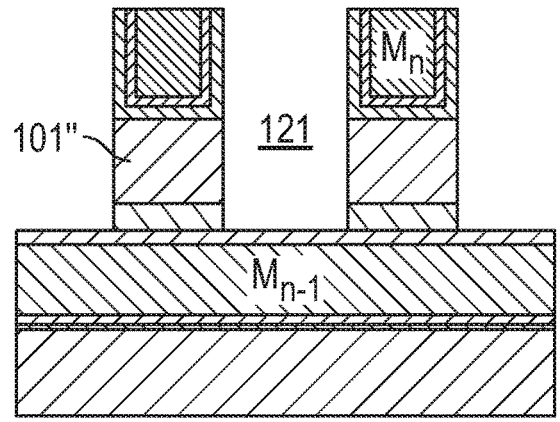

FIG. 1B entails etching a void 121 in the dielectric material of the second metal layer 102 and first dielectric layer 101'. The void 121 extends from a top of the first metal line 111 to a top of the additional layer 132. In response to etching the void 121, a portion 101" of the first dielectric layer remains between the first metal line 111 and the additional layer 132.

Figure 1C:
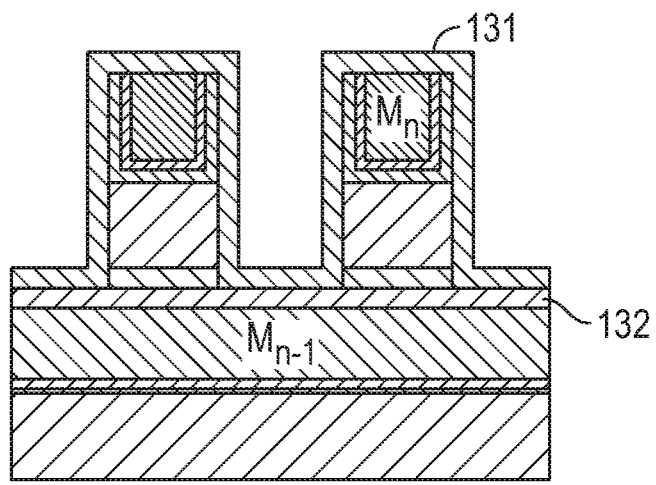

FIG. 1C includes forming a conformal layer 131 on the bottom and opposing sidewalls of the void 121. This conformal layer may be deposited using atomic layer deposition (ALD), chemical vapor deposition (CVD), and the like. Layer 131 may function as a seal to protect void 121, prevent migration of elements, avoid oxidation of metal, and the like.

Figure 1D:
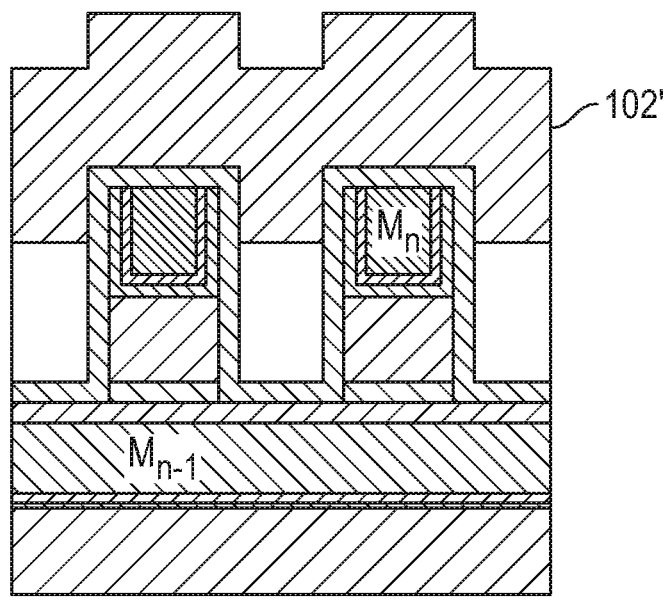

FIG. 1D includes forming a second dielectric layer 102' on the second metal layer 102. In response to forming the second dielectric layer on the second metal layer, air is enclosed within void 121 thereby forming an airgap. This "air" may include ambient air or some gas such as nitrogen.

Figure 1E:
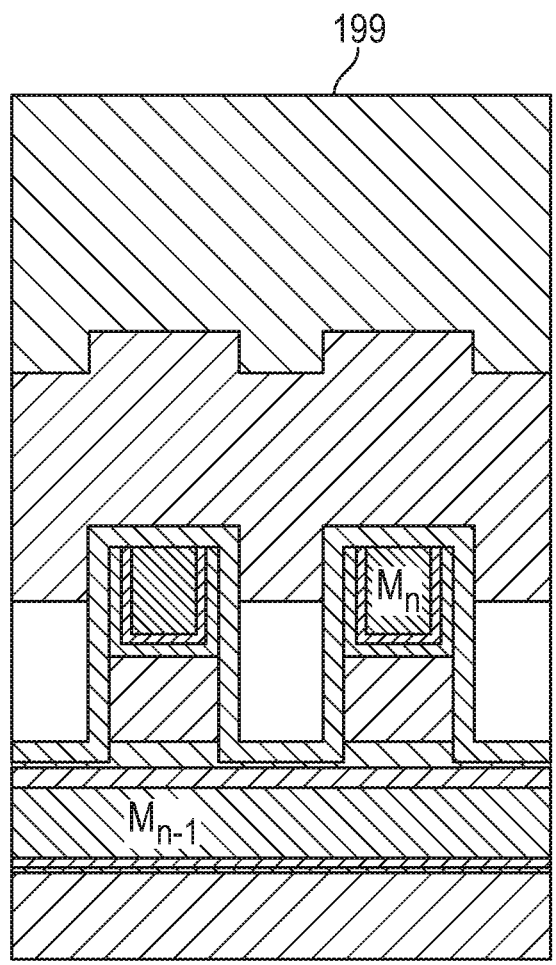
Figure 1F:
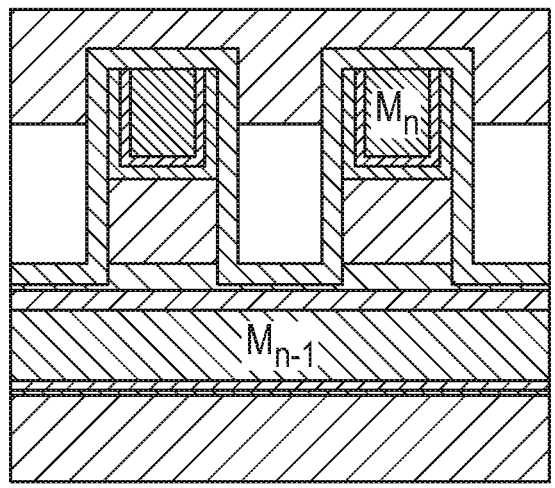
Figure 1G:
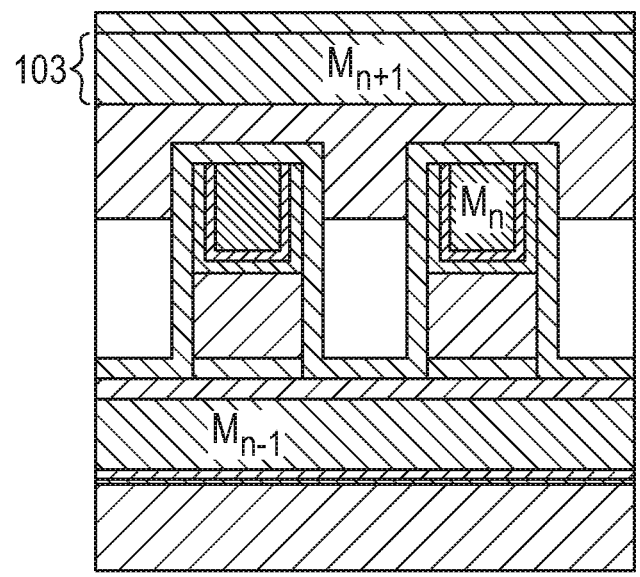

FIG. 1E includes adding sacrificial layer 199 to enable planarization of layer 102'. For example, as layer 102' is deposited the layer may dip downwards where airgaps exist. These uneven portions of layer 102' are planarized to enable buildup layers to be formed on layer 102'. FIG. 1F includes the etch or removal of layer 199 and the planarization of layer 102'. FIG. 1F includes forming a third metal layer 103 on the second dielectric layer 102'.

Figure 3:
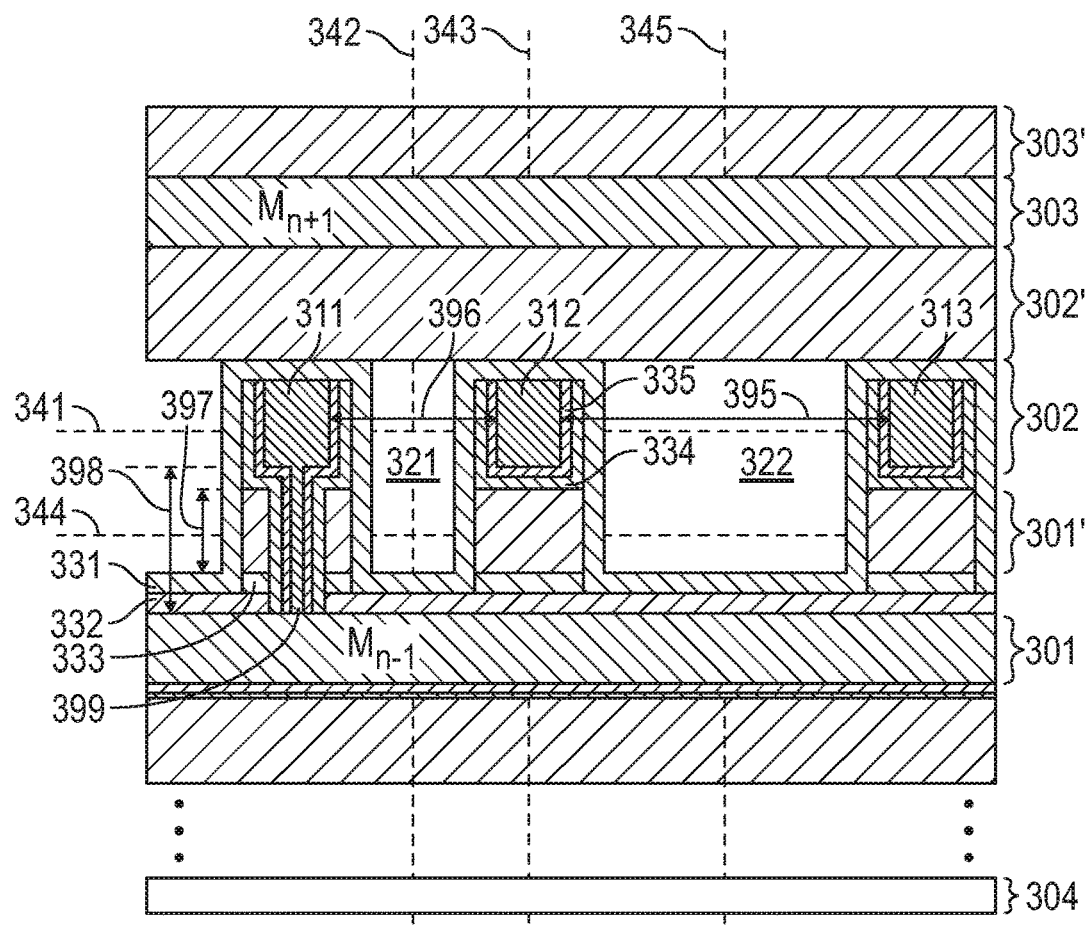
FIG. 3 includes a detailed depiction of an airgap architecture in an embodiment.

FIG. 3 includes a detailed depiction of an airgap architecture in an embodiment. FIG. 3 includes an IC system comprising first, second, and third metal layers 301, 302, 303. The second metal layer 302 is between the first and third metal layers 301, 303. First, second, and third metal lines 311, 312, 313 are included in the second metal layer 302. Layer 304 includes transistors. The first metal layer 301 is between a layer including transistors 304 and the second metal layer 302.

A first void 321 (e.g., airgap including air) is between the first and second metal lines 311, 312. A second void 322 (e.g., airgap including air) is between the second and third metal lines 312, 313. A conformal layer 331 is between the first and second metal lines 311, 312. An additional layer 332, such as a robust etch stop layer, is between the first and second metal layers 301, 302.

First axis 341 intersects the first, second, and third metal lines and the first and second voids. Second axis 342, which is orthogonal to the first axis 341, intersects the conformal layer 331 and the additional layer 332. Third axis 343, which is orthogonal to the first axis 341, intersects the second metal line 312 and the additional layer 332.

Additional layer 332 may serve as a robust etch stop layer to help control the etch depth of the airgaps 321, 322, thereby allowing those airgaps to extend far below the metal lines 311, 312. In an embodiment layer 332 includes at least one of oxygen, nitrogen, carbon, and combinations thereof. Layer 332 also includes a metal. For example, the metal includes at least one of aluminum, hafnium, zirconium, and combinations thereof. Therefore, embodiments include layer 332 comprising, for example, aluminum oxide and/or hafnium oxide and combinations thereof. However, in other embodiments the additional layer 332 includes at least one of oxygen, nitrogen, carbon, and combinations thereof. For instance, layer 332 may include a carbon-doped nitride. Many different material combinations may suffice for layer 332. A criterion for selecting the materials of layer 332 is to ensure etch selectivity with respect to the dielectric material of layer 301'. For instance, an etch selectivity of at least 20 (where etch rate of dielectric is 20 times that of layer 332) would allow the manufacturer a margin of error in timing the etch to not only form voids 321, 322 but to also ensure the voids are deep and extend far below metal lines 311, 312, 313 (all without over-etching into an underlying layer, such as an underlying metal layer). As addressed above, the deeper voids/airgaps help to better control capacitance for the IC.

Regarding etch selectivity of layer 332, etch rates depend on the material to be etched, the etchant, and possibly even the tool used to perform the etching. Nevertheless, to serve as a benchmark in an embodiment various materials have the following properties. Dielectric material included in the first dielectric layer 301' has a first etch rate corresponding to an etchant where the etchant includes hydrofluoric acid (HF) at a concentration of 50:1 [water:HF]. This is not to say that all embodiments must use this etchant to form voids 321, 322 but only to provide a benchmark for identifying materials suitable for layers 301' and 332. Continuing with the benchmark, the additional layer 332 has a second etch rate corresponding to HF at a concentration of 50:1. In an embodiment, the first etch rate is at least 15 times greater than the second etch rate. In other words, the etch selectivity is at least 15:1. However, in other embodiments the duration (time) of the etch and thickness of layers such as layer 301' may dictate a selectivity between layers 301':332 of 10:1, 20:1, 25:1, 30:1 or higher.

Continuing with the benchmarking, embodiments may include an optional layer such as layer 333. Layer 333 is between the additional layer 332 and the first dielectric layer 301'. Layer 333 has a third etch rate corresponding to the HF at a concentration of 50:1. The first etch rate (for layer 301' with HF at a concentration of 50:1) is greater than the third etch rate and the second etch rate (for layer 332 with HF at a concentration of 50:1) is less than the third etch rate. Thus, layer 333 may serve an etch stop role but not necessarily to the extent (in terms of selectivity) of layer 332. Layer 333 may be included as remnant of past buildup processes and may be present on a bottom of voids 321, 322 or may be only beneath remnants of dielectric layer 301'. For example, axis 343 may intersect layer 333 but axis 342 may not intersect layer 333.

For example, to obtain the selectivity addressed above if wet etch HF at a concentration of 50:1 is used then layer 332 may include carbon doped nitride (with layer 301' including silicon oxide). However, if the etchant used is a dry etch fluoro-carbon (e.g., $CF_4$) then layer 332 may include aluminum oxide (with layer 301' including silicon oxide) to ensure a selectivity of 10, 15, 20 or more.

Regarding conformal layer 331 in particular, in an embodiment conformal layer 331 directly contacts the additional layer 332. For example, fourth axis 344 (which is parallel to the first axis 341) intersects the conformal layer 331. Further, in the embodiment of FIG. 3 the fourth axis 344 intersects the first and second voids 321, 322 but does not intersect any of the first, second, and third metal lines 311, 312, 313. In this same embodiment, the conformal layer 331 directly contacts the first and second voids 321, 322. As noted in FIG. 1C, the conformal layer is applied after void formation and serves as a sealant layer to prevent material migration, oxidation, and the like.

Still addressing conformal layer 331, in an embodiment the dielectric material of first dielectric layer 301' is between the additional layer 332 and the second metal line 312. For example, note how axis 343 intersects layer 301', line 312, and layer 332. Further, in the same embodiment the conformal layer 331 directly contacts the additional layer 332 and the conformal layer 331 directly contacts the second void 322. To this end, axis 345 (which is orthogonal to the first axis 341) intersects the conformal layer 331 and the additional layer 332. The conformal layer 331 directly contacts the additional layer 332 at a location and the axis 345 intersects the location. The axis 345 is between the second and third metal lines 312, 313 and intersects the second void 322.

In an embodiment, the conformal layer 331 includes silicon and the conformal layer further includes at least one of nitrogen, oxygen, and carbon. For example, the conformal layer may include silicon nitride, silicon carbide, silicon oxynitride, aluminum oxide or other ALD metal oxides, and combinations thereof.

The embodiment of FIG. 3 includes first, second, and third dielectric layers 301', 302', 303' wherein the second metal layer 302 is between the first and second dielectric layers 301', 302'. Further, the third metal layer 303 is between the second and third dielectric layers 302', 303'.

In an embodiment the dielectric material of any of layers 301', 302', 303' may include silicon and oxygen (e.g., silicon dioxide). However, in other embodiments other dielectric materials may be used such as silicon nitride, silicon oxynitride, Alumina, carbon doped oxide, carbides, nitrides, and combinations thereof.

The embodiment of FIG. 3 further includes a via 399. The via 399 couples the first metal layer 301 to the first metal line 311. The via has a height 398 measured orthogonal to the first axis 341 and extending from the first metal layer 301 to the first metal line 311. A dielectric material is included in the first dielectric layer 301. The dielectric material surrounds the via 399 in a plane that is parallel to the first axis (e.g., a plane "coming out of the page" and orthogonal to the plane of the IC cross-section shown in FIG. 3). The dielectric material has a height 397, measured orthogonal to the first axis, of at least 50% of the height of the via.

In the embodiment of FIG. 3, the second metal line 312 is the only metal line located between the first and third metal lines 311, 313 in a plane that is parallel to both of the first and second axes 341, 342. The first and second metal lines 311, 312 are separated from each other by a first width 396 taken along the first axis. The second and third metal lines 312, 313 are separated from each other by a second width 395 taken along the first axis. The second width is at least two times the first width. Thus, void 322 is in an area of lower component density than that of void 321. Yet, due to layer 322 an aggressive etch may be employed that allows airgap 322, as well as airgap 321, to be etched deeply such that layer 331 can directly contact layer 332. However, in other embodiments a portion of layer 333 and/or layer 301' may exist between layers 331 and 332 directly below voids 321, 322.

Figure 2:
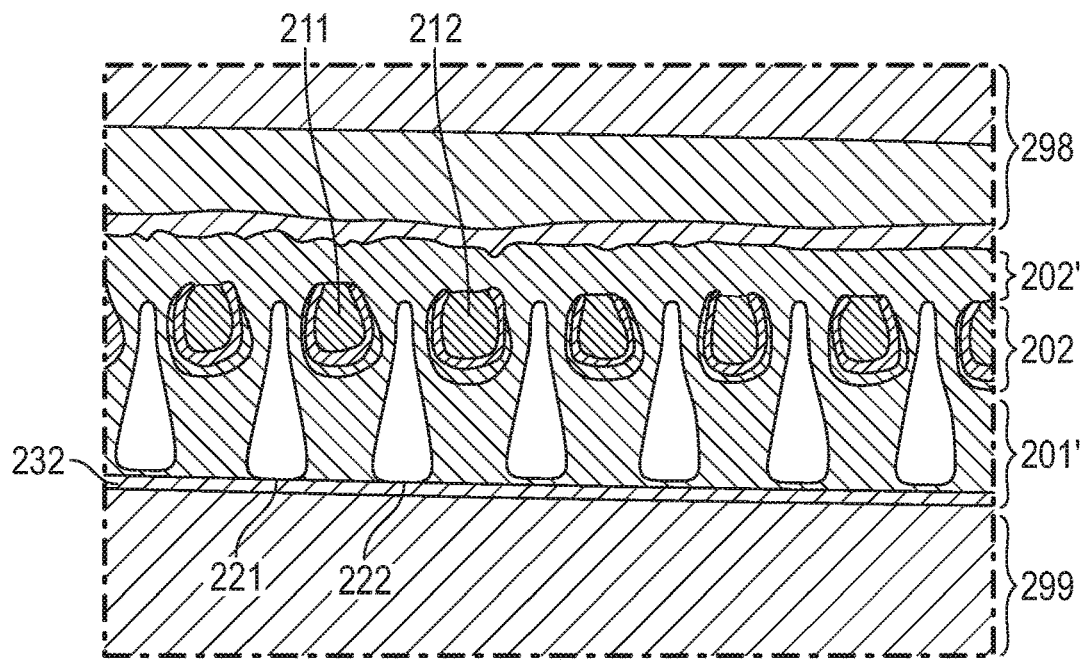
FIG. 2 includes a depiction of an image of an airgap architecture in an embodiment.

FIG. 2 includes a depiction of an image of an airgap architecture in an embodiment. Airgaps 221, 222 extend far below metal lines 211, 212 (where lines 211, 212 are included in metal layer 202). They extend from a top of metal lines 211, 212 to a bottom of dielectric layer 201'. The airgaps stop abruptly where they encounter robust etch stop layer 232, which is analogous to layer 332 of FIG. 3. Other airgaps shown in FIG. 2 do not necessarily extend all the way through layer 201'. The airgaps are formed (or at least sealed) when dielectric layer 202' is laid over metal layer 202. Other buildup layers (e.g., layers 299 and 298) are not necessarily identified as they provide only context to show airgaps 221, 222 are located in the back end of an IC. Conformal layers (such as layer 331) are not immediately visible in this rendering.

Figure 4:
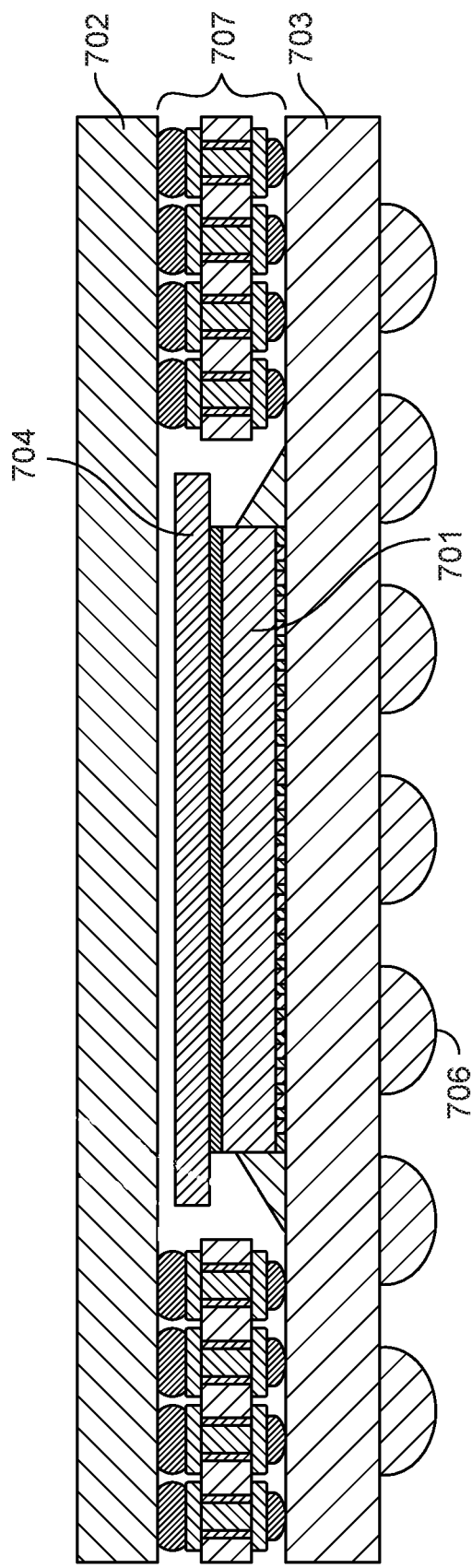
FIG. 4 includes a package including airgaps in an embodiment.

FIG. 4 includes a package system in an embodiment. The system includes a processor die 701 (a first package) on a package substrate 703. A memory die (a second package) 702 couples to the substrate 703 by way of interposer system 707. Underfill material exists between die 701 and substrate 703. Substrate 703 may include controlled collapse chip connection (C4) interconnects 706. Further, to prevent warping of die 701, die 701 may couple to a metal stiffener 704. Die 701 may include a die stack (e.g., multiple dies which may have the same function or differing functions) that may be molded as one unit that functions as a single die. For example, one die of the stack may have a first logic function while another die of the stack has another logic function that differs from the first logic function.

In the embodiment of FIG. 4, die 701 includes airgaps such as the airgaps of FIGS. 1-3. In another embodiment die 702 includes airgaps such as the airgaps of FIGS. 1-3. In an embodiment die 701 includes airgaps such as the airgaps of FIGS. 1-3 and die 702 includes airgaps such as the airgaps of FIGS. 1-3.

In an embodiment element 704 is not a stiffener but instead is a heat spreader (or is both a stiffener and a heat spreader). A heat spreader is a heat exchanger that moves heat between a heat source and a secondary heat exchanger whose surface area and geometry are more favorable than the source. Such a spreader may be a plate made of copper, which has a high thermal conductivity. By definition, heat is "spread out" over this geometry, so that the secondary heat exchanger may be more fully utilized. This has the potential to increase the heat capacity of the total assembly.

Thus, FIG. 4 depicts an IC, a memory, and a package housing that includes the IC and the memory. The IC includes airgaps such as the airgaps of FIGS. 1-3. For example, the circuit may be a processor with airgaps located in the back end or front end of the processor. For example, the circuit may be a field programmable gate array (FPGA) with airgaps located in the back end or front end of the FPGA. In other embodiments, the memory (in addition to the IC or instead of the IC) includes airgaps such as any of the airgaps of FIGS. 1-3.

Figure 5:
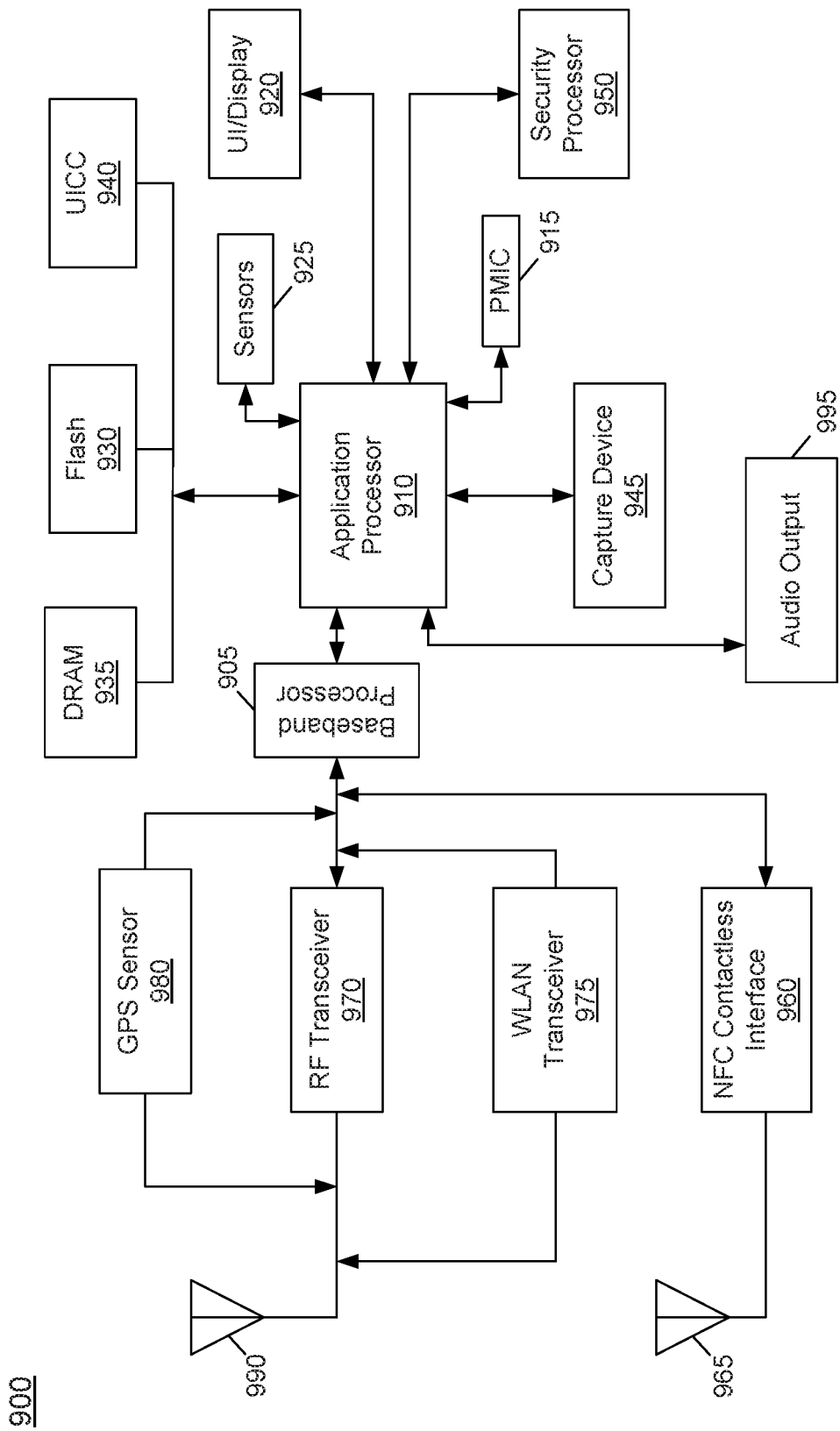
FIGS. 5, 6, 7 include systems that include embodiments of airgaps.

Referring now to FIG. 5, shown is a block diagram of an example system with which embodiments can be used. As seen, system 900 may be a smartphone or other wireless communicator or any other Internet of Things (IoT) device. A baseband processor 905 (which may include airgaps described herein) is configured to perform various signal processing with regard to communication signals to be transmitted from or received by the system. In turn, baseband processor 905 is coupled to an application processor 910, which may be a main CPU (which may include airgaps described herein) of the system to execute an OS and other system software, in addition to user applications such as many well-known social media and multimedia apps. Application processor 910 may further be configured to perform a variety of other computing operations for the device.

In turn, application processor 910 can couple to a user interface/display 920 (e.g., touch screen display) (which may include airgaps described herein). In addition, application processor 910 may couple to a memory system including a non-volatile memory (which may include airgaps described herein), namely a flash memory 930 and a system memory, namely a DRAM 935. As further seen, application processor 910 also couples to audio output 995 and a capture device 945 such as one or more image capture devices that can record video and/or still images.

A universal integrated circuit card (UICC) 940 (which may include airgaps described herein) comprises a subscriber identity module, which in some embodiments includes a secure storage to store secure user information. System 900 may further include a security processor 950 (e.g., Trusted Platform Module (TPM)) (which may include airgaps described herein) that may couple to application processor 910. A plurality of sensors 925 (which may include airgaps described herein), including one or more multi-axis accelerometers may couple to application processor 910 to enable input of a variety of sensed information such as motion and other environmental information. In addition, one or more authentication devices may be used to receive, for example, user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 (which may include airgaps described herein) couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more internet of things (IoT) networks, various circuitry may be coupled between baseband processor 905 and an antenna 990. Specifically, a radio frequency (RF) transceiver 970 (which may include airgaps described herein) and a wireless local area network (WLAN) transceiver 975 (which may include airgaps described herein) may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 980 (which may include airgaps described herein) may be present, with location information being provided to security processor 950 for use as described herein when context information is to be used in a pairing process. Other wireless communications such as receipt or transmission of radio signals (e.g., AM/FM) and other signals may also be provided. In addition, via WLAN transceiver 975, local wireless communications, such as according to a Bluetooth™ or IEEE 802.11 standard can also be realized.

Figure 6:
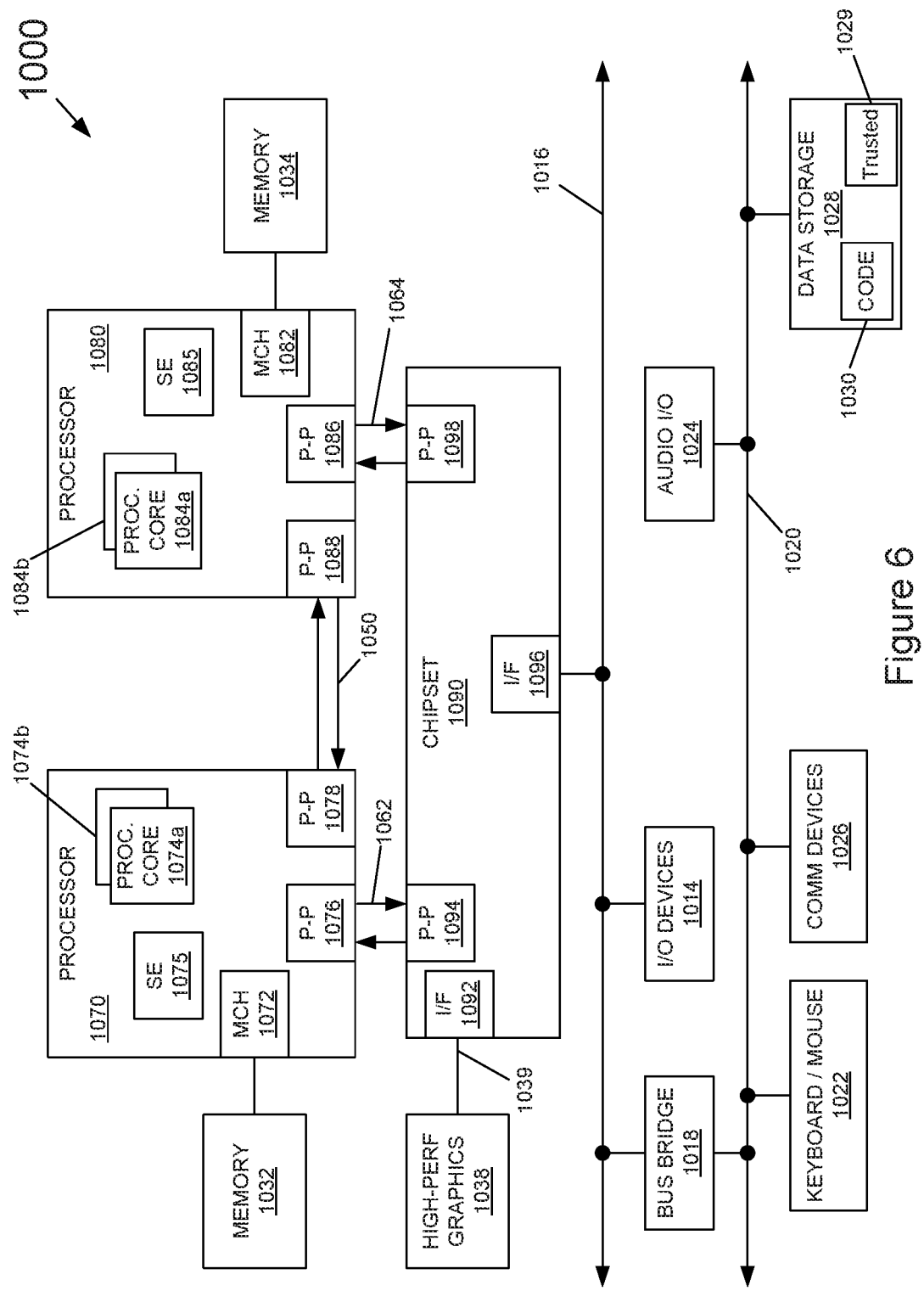

Referring now to FIG. 6, shown is a block diagram of a system in accordance with another embodiment of the present invention. Multiprocessor system 1000 is a point-to-point interconnect system such as a server system, and includes a first processor 1070 and a second processor 1080 coupled via a point-to-point interconnect 1050. Each of processors 1070 and 1080 may be multicore processors (which may include airgaps described herein) such as SoCs, including first and second processor cores (i.e., processor cores 1074*a* and 1074*b* and processor cores 1084*a* and 1084*b*), although potentially many more cores may be present in the processors. In addition, processors 1070 and 1080 each may include a secure engine 1075 and 1085 to perform security operations such as attestations, IoT network onboarding or so forth.

First processor 1070 further includes a memory controller hub (MCH) 1072 and point-to-point (P-P) interfaces 1076 and 1078. Similarly, second processor 1080 includes a MCH 1082 and P-P interfaces 1086 and 1088. MCH's 1072 and 1082 couple the processors to respective memories, namely a memory 1032 and a memory 1034, which may be portions of main memory (e.g., a DRAM) locally attached to the respective processors. First processor 1070 and second processor 1080 may be coupled to a chipset 1090 (which may include airgaps described herein) via P-P interconnects 1062 and 1064, respectively. Chipset 1090 includes P-P interfaces 1094 and 1098.

Furthermore, chipset 1090 includes an interface 1092 to couple chipset 1090 with a high performance graphics engine 1038, by a P-P interconnect 1039. In turn, chipset 1090 may be coupled to a first bus 1016 via an interface 1096. Various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 (which may include airgaps described herein) such as a non-volatile storage or other mass storage device. As seen, data storage unit 1028 may include code 1030, in one embodiment. As further seen, data storage unit 1028 also includes a trusted storage 1029 to store sensitive information to be protected. Further, an audio I/O 1024 may be coupled to second bus 1020.

Figure 7:
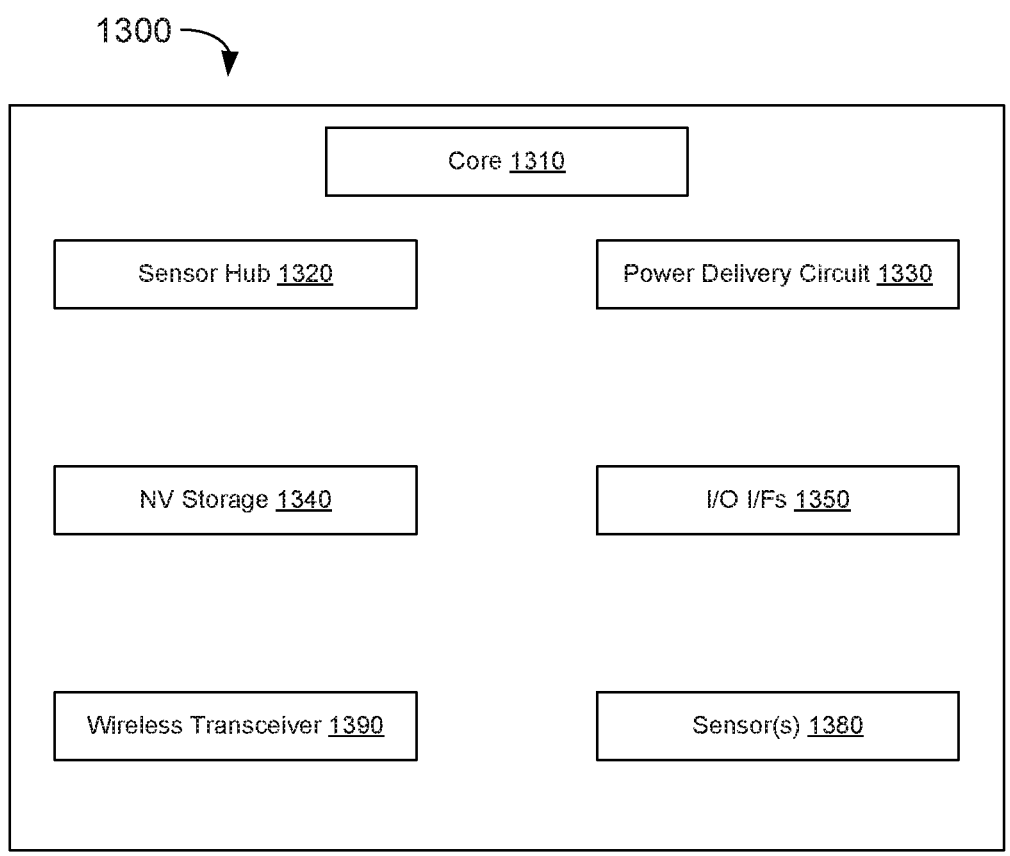

Referring now to FIG. 7, embodiments may be used in environments where IoT devices may include wearable devices or other small form factor IoT devices. Shown is a block diagram of a wearable module 1300 in accordance with another embodiment. In one particular implementation, module 1300 (which may include airgaps described herein) may be an Intel® Curie™ module that includes multiple components adapted within a single small module that can be implemented as all or part of a wearable device. As seen, module 1300 includes a core 1310 (of course in other embodiments more than one core may be present). Such core may be a relatively low complexity in-order core, such as based on an Intel Architecture® Quark™ design. In some embodiments, core 1310 may implement a Trusted Execution Environment (TEE). Core 1310 couples to various components including a sensor hub 1320 (which may include airgaps described herein), which may be configured to interact with a plurality of sensors 1380, such as one or more biometric, motion environmental or other sensors. A power delivery circuit 1330 (which may include airgaps described herein) is present, along with a non-volatile storage 1340 (which may include airgaps described herein). In an embodiment, this circuit may include a rechargeable battery and a recharging circuit, which may in one embodiment receive charging power wirelessly. One or more input/output (IO) interfaces 1350, such as one or more interfaces compatible with one or more of USB/SPI/I2C/GPIO protocols, may be present. In addition, a wireless transceiver 1390, which may be a Bluetooth™ low energy or other short-range wireless transceiver is present to enable wireless communications as described herein. Understand that in different implementations a wearable module can take many other forms. Wearable and/or IoT devices have, in comparison with a typical general purpose CPU or a GPU, a small form factor, low power requirements, limited instruction sets, relatively slow computation throughput, or any of the above.

The following examples pertain to further embodiments.

Example 1

An integrated circuit system comprising: first, second, and third metal layers, the second metal layer being between the first and third metal layers; first, second, and third metal lines included in the second metal layer; a layer including airgaps, the first metal layer being between the layer including airgaps and the second metal layer; a first void between the first and second metal lines and a second void between the second and third metal lines; a conformal layer between the first and second metal lines; an additional layer between the first and second metal layers; wherein the first void includes air and the second void includes air; wherein a first axis intersects the first, second, and third metal lines and the first and second voids; wherein a second axis, orthogonal to the first axis, intersects the conformal layer and the additional layer; wherein a third axis, orthogonal to the first axis, intersects the second metal line and the additional layer.

Example 2

The system of example 1: the additional layer includes at least one of oxygen, nitrogen, and carbon; the additional layer further includes a metal.

Example 3

The system of example 2 wherein the metal includes at least one of aluminum and hafnium.

Example 4

The system of example 2 wherein the conformal layer directly contacts the additional layer.

Example 5

The system of example 2 wherein a fourth axis, parallel to the first axis, intersects the conformal layer.

Example 6

The system of example 5 wherein the fourth axis intersects the first and second voids but does not intersect any of the first, second, and third metal lines.

Example 7

The system of example 6 wherein the conformal layer directly contacts the first and second voids.

Example 8

The system of example 7 comprising first, second, and third dielectric layers, wherein: the second metal layer is between the first and second dielectric layers; the third metal layer is between the second and third dielectric layers.

Example 9

The system of example 8, wherein: a dielectric material included in the first dielectric layer has a first etch rate corresponding to an etchant, the etchant including hydrofluoric acid (HF) at a concentration of 50:1 [water:HF]; the additional layer has a second etch rate corresponding to the etchant; the first etch rate is at least 15 times greater than the second etch rate.

Example 10

The system of example 9, wherein: the conformal layer has a third etch rate corresponding to the etchant; the first etch rate is greater than the third etch rate; the second etch rate is less than the third etch rate.

Example 11

The system of example 9 comprising another layer between the additional layer and the first dielectric layer, wherein: the another layer has a third etch rate corresponding to the etchant; the first etch rate is greater than the third etch rate; the second etch rate is less than the third etch rate.

Example 12

The system of example 11, wherein: the second axis does not intersect the another layer; and the third axis intersects the another layer.

Example 13

The system of example 8 wherein a dielectric material is included in the first dielectric layer; the dielectric material is between the additional layer and the second metal line; the conformal layer directly contacts the additional layer; the conformal layer directly contacts the second void.

Example 14

The system of example 13 wherein the dielectric material includes silicon and oxygen.

Example 15

The system of example 7 comprising a via, wherein: the via couples the first metal layer to the first metal line of the second metal layer; the via has a height measured orthogonal to the first axis and extending the first metal layer to the first metal line of the second metal layer; a dielectric material is included in the first dielectric layer; the dielectric material surrounds the via in a plane that is parallel to the first axis; the dielectric material has a height, measured orthogonal to the first axis, of at least 50% of the height of the via.

Example 16

The system of example 2 wherein: the second metal line is the only metal line located between the first and third metal lines in a plane that is parallel to both of the first and second axes; the first and second metal lines are separated from each other by a first width taken along the first axis; the second and third metal lines are separated from each other by a second width taken along the second axis; the second width is at least two times the first width.

Example 17

The system of example 16 wherein: a fourth axis, orthogonal to the first axis, intersects the conformal layer and the additional layer; the conformal layer directly contacts the additional layer at a location; the fourth axis intersects the location; the fourth axis between the second and third metal lines and intersects the second void.

Example 18

The system of example 2 wherein: the conformal layer includes silicon; the conformal layer further includes at least one of nitrogen, oxygen, and carbon.

Example 19

The system of example 1 wherein the additional layer includes at least one of oxygen, nitrogen, and carbon.

Example 20

The system of example 1 comprising: an integrated circuit; a memory; a package housing that includes the integrated circuit and the memory; wherein at least one of the integrated circuit and the memory includes the second metal line.

Example 21

The system of example 20 wherein the integrated circuit comprises a field programmable gate array (FPGA).

Example 22

The system of example 20 comprising a server, the server including the package.

Example 23

The system of example 20 comprising: a radiofrequency receiver; and a chassis; wherein the chassis includes the radiofrequency receiver and the package.

Example 24

A method comprising: forming a layer of airgaps; forming a first metal layer on the layer of airgaps; forming an additional layer on the first metal layer; forming a first dielectric layer on the additional layer; forming first and second metal lines in the first dielectric layer, the first and second metal lines being included in a second metal layer; etching a void in the first dielectric layer, the void extending from a top of the first metal line to a top of the additional layer; in response to etching the void in the first dielectric layer, leaving a portion of the first dielectric layer between the first metal line and the additional layer; forming a conformal layer on a bottom and opposing sidewalls of the void; forming a second dielectric layer on the second metal layer; in response to forming the second dielectric layer on the second metal layer, enclosing air within the void; forming a third metal layer on the second dielectric layer; wherein a first axis intersects the first and second metal lines and the void; wherein a second axis, orthogonal to the first axis, intersects the conformal layer and the additional layer; wherein a third axis, orthogonal to the first axis, intersects the second metal line and the additional layer.

Example 25

The method of example 24, wherein: the additional layer includes at least one of oxygen, nitrogen, and carbon; the additional layer further includes at least one of aluminum and hafnium; the conformal layer directly contacts the additional layer; the conformal layer directly contacts the void.

Example 1a

An integrated circuit system comprising: a first interconnect layer that includes a metal, a second interconnect layer that includes the metal, and a third interconnect layer that includes the metal, wherein the second interconnect layer is between the first and third interconnect layers; a first interconnect line that includes the metal, a second interconnect line that includes the metal, and a third interconnect line that includes the metal, wherein the second interconnect layer includes the first, second, and third interconnect lines; a layer that includes transistors, wherein the first interconnect layer is between the layer that includes transistors and the second interconnect layer; a first void between the first and second interconnect lines; a second void between the second and third interconnect lines; a conformal layer between the first and second interconnect lines; and an additional layer between the first and second interconnect layers; wherein the first void is hollow and includes air and the second void is hollow and includes air; wherein: (a) a first axis intersects the first, second, and third interconnect lines and the first and second voids; (b) a second axis, orthogonal to the first axis, intersects the conformal layer and the additional layer; and (c) a third axis, orthogonal to the first axis, intersects the second interconnect line and the additional layer.

For example and as addressed in the "Background", an "interconnect line" and "interconnect layer" refer to the various metal layers interconnected by interconnects, which may include a line portion (sometimes referred to as a trace or wire). Thus, an interconnect layer includes interconnects such as interconnect lines. The layers may include, for example, copper which is formed into copper lines.

The voids are "hollow" such as the void 221 of FIG. 2. In other words, they are air gaps. The "hollow" means they are not voids that have been filled with dielectric material or some other material.

Example 2a

The system of example 1a: the additional layer includes at least one of oxygen, nitrogen, carbon, and combinations thereof; the additional layer further includes an additional metal.

Example 3a

The system of example 2a wherein the additional metal includes at least one of aluminum, hafnium, zirconium, and combinations thereof.

Example 4a

The system of example 1a wherein: the conformal layer directly contacts a first surface of the additional layer; a second surface of the additional layer directly contacts the first interconnect layer; the first and second surfaces of the additional layer directly oppose one another.

Example 5a

The system of example 2a wherein the conformal layer directly contacts the additional layer.

Example 6a

The system of example 5a wherein a fourth axis, parallel to the first axis, intersects the conformal layer and the first and second voids but does not intersect any of the first, second, and third interconnect lines.

Example 7a

The system of example 6a wherein the conformal layer directly contacts the first and second voids.

Example 8a

The system of example 7a comprising: a first layer that includes a dielectric material; a second layer that includes the dielectric material; a third layer that includes the dielectric material; wherein: (a) the second interconnect layer is between the first layer that includes the dielectric material and the second layer that that includes the dielectric material; and (b) the third interconnect layer is between the second layer that includes the dielectric material and the third layer that includes the dielectric material.

Example 9a

The system of example 8a, wherein: the dielectric material has a first etch rate corresponding to an etchant, the etchant including carbon and fluorine; the additional layer has a second etch rate corresponding to the etchant; the first etch rate is at least 15 times greater than the second etch rate.

Another version of Example 9a. The system of example 8a, wherein: the dielectric material has a first etch rate corresponding to an etchant, the etchant includes $CF_4$; the additional layer has a second etch rate corresponding to the etchant; the first etch rate is at least 15 times greater than the second etch rate.

Another version of Example 9a. The system of example 8a, wherein: the dielectric material has a first etch rate corresponding to an etchant, the etchant includes $SF_6$; the additional layer has a second etch rate corresponding to the etchant; the first etch rate is at least 15 times greater than the second etch rate.

Example 10a

The system of example 9a comprising another layer between the additional layer and the first layer that includes the dielectric material, wherein: the another layer has a third etch rate corresponding to the etchant; the first etch rate is greater than the third etch rate; the second etch rate is less than the third etch rate.

Example 11a

The system of example 10a, wherein: the second axis intersects the first void; the second axis does not intersect the another layer; the second axis does not intersect the first layer that includes the dielectric material; the third axis intersects the another layer.

Example 12a

The system of example 8a wherein: a portion of the first layer that includes the dielectric material is between the additional layer and the second interconnect line; the conformal layer directly contacts the portion; the conformal layer directly contacts the second void.

Example 13a

The system of example 12a wherein the dielectric material includes silicon, oxygen, and combinations thereof.

Example 14a

The system of example 8a comprising a via, wherein: the via couples the first interconnect layer to the first interconnect line; the via has a height measured orthogonal to the first axis and extending from the first interconnect layer to the first interconnect line; a portion of dielectric material of the first layer that includes the dielectric material surrounds the via in a plane that is parallel to the first axis; the portion has a height, measured orthogonal to the first axis, of at least 50% of the height of the via; the first void extends from the second layer that includes the dielectric material to a first half of the via, wherein the first half of the via is between a second half of the via and the first interconnect layer.

Example 15a

The system of example 2a wherein: the second interconnect line is the only interconnect line located between the first and third interconnect lines in a plane that is parallel to both of the first and second axes; the first and second interconnect lines are separated from each other by a first width taken along the first axis; the second and third interconnect lines are separated from each other by a second width taken along the second axis; the second width is at least two times the first width.

Example 16a

The system of example 15a wherein: a fourth axis is orthogonal to the first axis; the fourth axis intersects the second void, the conformal layer, and the additional layer; the conformal layer directly contacts the second void; the conformal layer directly contacts the additional layer at a first location; the additional layer directly contacts the first interconnect layer at a second location; the fourth axis intersects the first and second locations; and the fourth axis is between the second and third interconnect lines.

Example 17a

The system of example 2a wherein: the conformal layer includes silicon; the conformal layer further includes at least one of nitrogen, oxygen, carbon, and combinations thereof.

Example 18a

The system of example 1a wherein: the additional layer includes silicon; the additional layer further includes at least one of oxygen, nitrogen, carbon, and combinations thereof.
Another version of Example 18a. The system of example 1a wherein: the additional layer includes a carbon doped nitride.

Example 19a

The system of example 1a comprising: an integrated circuit; a memory; and a package housing that includes the integrated circuit and the memory; wherein one of the integrated circuit and the memory includes the first and second voids.

Example 20a

The system of example 19a wherein the integrated circuit comprises a field programmable gate array (FPGA).

Example 21a

The system of example 19a comprising: a radiofrequency receiver; and a chassis; wherein the chassis includes the radiofrequency receiver and the package.

Example 22a

A method comprising: forming a layer of transistors; forming a first interconnect layer on the layer of transistors, the first interconnect layer including a metal; forming an additional layer on the first interconnect layer; forming a first layer that includes a dielectric material, wherein forming the first layer that includes the dielectric material includes forming the first layer that includes the dielectric material on the additional layer; forming a first interconnect line in a second interconnect layer, wherein the first interconnect line includes the metal, the second interconnect layer includes the metal, and the second interconnect layer is formed on the first interconnect layer; forming a second interconnect line in the second interconnect layer, wherein the second interconnect line includes the metal; etching a void in the first layer that includes the dielectric material, the void extending from a top of the first interconnect line to a top of the additional layer; in response to etching the void in the first layer that includes the dielectric material, leaving a portion of the first layer that includes the dielectric material between the first interconnect line and the additional layer; forming a conformal layer on a bottom and opposing sidewalls of the void; forming a second layer that includes the dielectric material, wherein forming the second layer that includes the dielectric material includes forming the second layer that includes the dielectric material on the second interconnect layer; in response to forming the second layer that includes the dielectric material on the second interconnect layer, enclosing air within the void so the void is hollow; forming a third interconnect layer on the second layer that includes the dielectric material, wherein the third interconnect layer includes the metal; wherein (a) a first axis intersects the first and second interconnect lines and the void; (b) a second axis, orthogonal to the first axis, intersects the conformal layer and the additional layer; and (c) a third axis, orthogonal to the first axis, intersects the second interconnect line and the additional layer.

Example 23a

The method of example 22a, wherein: the additional layer includes at least one of oxygen, nitrogen, carbon, and combinations thereof; the additional layer further includes at least one of aluminum, hafnium, and combinations thereof; the conformal layer directly contacts the additional layer; and the conformal layer directly contacts the void.

Example 24a

An integrated circuit system comprising: first, second, and third interconnect wires included in a buildup layer; a first void between the first and second interconnect wires and a second void between the second and third interconnect wires; a conformal layer between the first and second interconnect wires; and an additional layer between the first interconnect wire and a substrate that includes transistors; wherein the first and second voids are hollow and include air; wherein (a) a first axis intersects the first, second, and third interconnect wires and the first and second voids; (b) a second axis, orthogonal to the first axis, intersects the conformal layer and the additional layer; and (c) a third axis, orthogonal to the first axis, intersects the second interconnect wire and the additional layer; wherein the conformal layer directly contacts the additional layer.

Example 25a

The system of example 24a wherein: the additional layer includes a metal; the additional layer includes at least one of oxygen, nitrogen, carbon, and combinations thereof.

Example 1b

An integrated circuit system comprising: a first interconnect layer that includes a metal, a second interconnect layer that includes the metal, and a third interconnect layer that includes the metal, wherein the second interconnect layer is between the first and third interconnect layers; a first interconnect line that includes the metal, a second interconnect line that includes the metal, and a third interconnect line that includes the metal, wherein the second interconnect layer includes the first, second, and third interconnect lines; a layer that includes transistors, wherein the first interconnect layer is between the layer that includes transistors and the second interconnect layer; a first void between the first and second interconnect lines; a second void between the second and third interconnect lines; a conformal layer between the first and second interconnect lines; and an additional layer between the first and second interconnect layers; wherein the first void is hollow and includes air and the second void is hollow and includes air; wherein: (a) a first axis intersects the first, second, and third interconnect lines and the first and second voids; (b) a second axis, orthogonal to the first axis, intersects the conformal layer and the additional layer; and (c) a third axis, orthogonal to the first axis, intersects the second interconnect line and the additional layer.

Example 2b

The system of example 1b: the additional layer includes at least one of oxygen, nitrogen, carbon, and combinations thereof; the additional layer further includes an additional metal.

Example 3b

The system of example 2b wherein the additional metal includes at least one of aluminum, hafnium, zirconium, and combinations thereof.

Example 4b

The system according to any of examples 1b-3b wherein: the conformal layer directly contacts a first surface of the additional layer; a second surface of the additional layer directly contacts the first interconnect layer; the first and second surfaces of the additional layer directly oppose one another.

Example 5b

The system according to any of examples 1b-3b wherein the conformal layer directly contacts the additional layer.

Example 6b

The system according to any of examples 1b-5b wherein a fourth axis, parallel to the first axis, intersects the conformal layer and the first and second voids but does not intersect any of the first, second, and third interconnect lines.

Example 7b

The system according to any of examples 1b-6b wherein the conformal layer directly contacts the first and second voids.

Example 8b

The system according to any of examples 1b-7b comprising: a first layer that includes a dielectric material; a second layer that includes the dielectric material; a third layer that includes the dielectric material; wherein: (a) the second interconnect layer is between the first layer that includes the dielectric material and the second layer that that includes the dielectric material; and (b) the third interconnect layer is between the second layer that includes the dielectric material and the third layer that includes the dielectric material.

Example 9b

The system of example 8b, wherein: the dielectric material has a first etch rate corresponding to an etchant, the etchant including carbon and fluorine; the additional layer has a second etch rate corresponding to the etchant; the first etch rate is at least 15 times greater than the second etch rate.

Another version of Example 9b. The system of example 8b, wherein: the dielectric material has a first etch rate corresponding to an etchant, the etchant includes $CF_4$; the additional layer has a second etch rate corresponding to the etchant; the first etch rate is at least 15 times greater than the second etch rate.

Example 10b

The system of example 9b comprising another layer between the additional layer and the first layer that includes the dielectric material, wherein: the another layer has a third etch rate corresponding to the etchant; the first etch rate is greater than the third etch rate; the second etch rate is less than the third etch rate.

Example 11b

The system of example 10b, wherein: the second axis intersects the first void; the second axis does not intersect the another layer; the second axis does not intersect the first layer that includes the dielectric material; the third axis intersects the another layer.

Example 12b

The system according to any of examples 8b-11b wherein: a portion of the first layer that includes the dielectric material is between the additional layer and the second interconnect

19 line; the conformal layer directly contacts the portion; the conformal layer directly contacts the second void.

Example 13b

The system according to any of examples 8b-12b wherein the dielectric material includes silicon, oxygen, and combinations thereof.

Example 14b

The system according to any of examples 8b-13b comprising a via, wherein: the via couples the first interconnect layer to the first interconnect line; the via has a height measured orthogonal to the first axis and extending from the first interconnect layer to the first interconnect line; a portion of dielectric material of the first layer that includes the dielectric material surrounds the via in a plane that is parallel to the first axis; the portion has a height, measured orthogonal to the first axis, of at least 50% of the height of the via; the first void extends from the second layer that includes the dielectric material to a first half of the via, wherein the first half of the via is between a second half of the via and the first interconnect layer.

Example 15b

The system according to any of examples 1b-14b wherein: the second interconnect line is the only interconnect line located between the first and third interconnect lines in a plane that is parallel to both of the first and second axes; the first and second interconnect lines are separated from each other by a first width taken along the first axis; the second and third interconnect lines are separated from each other by a second width taken along the second axis; the second width is at least two times the first width.

Example 16b

The system according to any of examples 1b-15b wherein: a fourth axis is orthogonal to the first axis; the fourth axis intersects the second void, the conformal layer, and the additional layer; the conformal layer directly contacts the second void; the conformal layer directly contacts the additional layer at a first location; the additional layer directly contacts the first interconnect layer at a second location; the fourth axis intersects the first and second locations; and the fourth axis is between the second and third interconnect lines.

Example 17b

The system according to any of examples 1b-16b wherein: the conformal layer includes silicon; the conformal layer further includes at least one of nitrogen, oxygen, carbon, and combinations thereof.

Example 18b

The system according to any of examples 1b-17b wherein: the additional layer includes silicon; the additional layer further includes at least one of oxygen, nitrogen, carbon, and combinations thereof.

Example 19b

The system according to any of examples 1b-18b comprising: an integrated circuit; a memory; and a package housing that includes the integrated circuit and the memory; wherein one of the integrated circuit and the memory includes the first and second voids.

Example 20b

The system of example 19b wherein the integrated circuit comprises a field programmable gate array (FPGA).

Example 21b

The system of example 19b comprising: a radiofrequency receiver; and a chassis; wherein the chassis includes the radiofrequency receiver and the package.

Example 22b

A method comprising: forming a layer of transistors; forming a first interconnect layer on the layer of transistors, the first interconnect layer including a metal; forming an additional layer on the first interconnect layer; forming a first layer that includes a dielectric material, wherein forming the first layer that includes the dielectric material includes forming the first layer that includes the dielectric material on the additional layer; forming a first interconnect line in a second interconnect layer, wherein the first interconnect line includes the metal, the second interconnect layer includes the metal, and the second interconnect layer is formed on the first interconnect layer; forming a second interconnect line in the second interconnect layer, wherein the second interconnect line includes the metal; etching a void in the first layer that includes the dielectric material, the void extending from a top of the first interconnect line to a top of the additional layer; in response to etching the void in the first layer that includes the dielectric material, leaving a portion of the first layer that includes the dielectric material between the first interconnect line and the additional layer; forming a conformal layer on a bottom and opposing sidewalls of the void; forming a second layer that includes the dielectric material, wherein forming the second layer that includes the dielectric material includes forming the second layer that includes the dielectric material on the second interconnect layer; in response to forming the second layer that includes the dielectric material on the second interconnect layer, enclosing air within the void so the void is hollow; forming a third interconnect layer on the second layer that includes the dielectric material, wherein the third interconnect layer includes the metal; wherein (a) a first axis intersects the first and second interconnect lines and the void; (b) a second axis, orthogonal to the first axis, intersects the conformal layer and the additional layer; and (c) a third axis, orthogonal to the first axis, intersects the second interconnect line and the additional layer.

Example 23b

The method of example 22b, wherein: the additional layer includes at least one of oxygen, nitrogen, carbon, and combinations thereof; the additional layer further includes at least one of aluminum, hafnium, and combinations thereof; the conformal layer directly contacts the additional layer; and the conformal layer directly contacts the void.

Example 24b

An integrated circuit system comprising: first, second, and third interconnect wires included in a buildup layer; a first void between the first and second interconnect wires and a second void between the second and third interconnect wires; a conformal layer between the first and second interconnect wires; and an additional layer between the first interconnect wire and a substrate that includes transistors; wherein the first and second voids are hollow and include air; wherein (a) a first axis intersects the first, second, and third interconnect wires and the first and second voids; (b) a second axis, orthogonal to the first axis, intersects the conformal layer and the additional layer; and (c) a third axis, orthogonal to the first axis, intersects the second interconnect wire and the additional layer; wherein the conformal layer directly contacts the additional layer.

Example 25b

The system of example 24b wherein: the additional layer includes a metal; the additional layer includes at least one of oxygen, nitrogen, carbon, and combinations thereof.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or IC is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An integrated circuit system comprising:
a first interconnect layer that includes a metal, a second interconnect layer that includes the metal, and a third interconnect layer that includes the metal, wherein the second interconnect layer is between the first and third interconnect layers;
a first interconnect line that includes the metal, a second interconnect line that includes the metal, and a third interconnect line that includes the metal, wherein the second interconnect layer includes the first, second, and third interconnect lines;
a layer that includes transistors, wherein the first interconnect layer is between the layer that includes transistors and the second interconnect layer;
a first void between the first and second interconnect lines;
a second void between the second and third interconnect lines;
a conformal layer between the first and second interconnect lines; and
an additional layer between the first and second interconnect layers;
wherein the first void is hollow and includes air and the second void is hollow and includes air;
wherein: (a) a first axis intersects the first, second, and third interconnect lines and the first and second voids; (b) a second axis, orthogonal to the first axis, intersects the conformal layer and the additional layer; and (c) a third axis, orthogonal to the first axis, intersects the second interconnect line and the additional layer.

2. The system of claim 1:
the additional layer includes at least one of oxygen, nitrogen, carbon, or combinations thereof;
the additional layer further includes an additional metal.

3. The system of claim 2 wherein the additional metal includes at least one of aluminum, hafnium, zirconium, or combinations thereof.

4. The system of claim 1 wherein:
the conformal layer directly contacts a first surface of the additional layer;
a second surface of the additional layer directly contacts the first interconnect layer;
the first and second surfaces of the additional layer directly oppose one another.

5. The system of claim 2 wherein the conformal layer directly contacts the additional layer.

6. The system of claim 5 wherein a fourth axis, parallel to the first axis, intersects the conformal layer and the first and second voids but does not intersect any of the first, second, and third interconnect lines.

7. The system of claim 6 wherein the conformal layer directly contacts the first and second voids.

8. The system of claim 7 comprising:
a first layer that includes a dielectric material;
a second layer that includes the dielectric material;
a third layer that includes the dielectric material;
wherein: (a) the second interconnect layer is between the first layer that includes the dielectric material and the second layer that that includes the dielectric material; and (b) the third interconnect layer is between the second layer that includes the dielectric material and the third layer that includes the dielectric material.

9. The system of claim 8, wherein:
the dielectric material has a first etch rate corresponding to an etchant, the etchant including carbon and fluorine;
the additional layer has a second etch rate corresponding to the etchant;
the first etch rate is at least 15 times greater than the second etch rate.

10. The system of claim 9 comprising another layer between the additional layer and the first layer that includes the dielectric material, wherein:
the another layer has a third etch rate corresponding to the etchant;
the first etch rate is greater than the third etch rate;
the second etch rate is less than the third etch rate.

11. The system of claim 10, wherein:
the second axis intersects the first void;
the second axis does not intersect the another layer;
the second axis does not intersect the first layer that includes the dielectric material;
the third axis intersects the another layer.

12. The system of claim 8 wherein:
a portion of the first layer that includes the dielectric material is between the additional layer and the second interconnect line;
the conformal layer directly contacts the portion;
the conformal layer directly contacts the second void;
the third axis intersects the portion of the first layer;
the layer that includes transistors includes first and second opposing surfaces;
the first surface is between the second surface and the first interconnect layer the first surface is substantially oriented in a plane;
the plane is substantially parallel to the first axis.

13. The system of claim 12 wherein the dielectric material includes silicon, oxygen, and combinations thereof.

14. The system of claim 8 comprising a via, wherein:
the via couples the first interconnect layer to the first interconnect line;
the via has a height measured orthogonal to the first axis and extending from the first interconnect layer to the first interconnect line;
a portion of dielectric material of the first layer that includes the dielectric material surrounds the via in a plane that is parallel to the first axis;
the portion has a height, measured orthogonal to the first axis, of at least 50% of the height of the via;
the first void extends from the second layer that includes the dielectric material to a first half of the via, wherein the first half of the via is between a second half of the via and the first interconnect layer.

15. The system of claim 2 wherein:
the second interconnect line is the only interconnect line located between the first and third interconnect lines in a plane that is parallel to both of the first and second axes;
the first and second interconnect lines are separated from each other by a first width taken along the first axis;
the second and third interconnect lines are separated from each other by a second width taken along the second axis;
the second width is at least two times the first width.

16. The system of claim 15 wherein:
a fourth axis is orthogonal to the first axis;
the fourth axis intersects the second void, the conformal layer, and the additional layer;
the conformal layer directly contacts the second void;
the conformal layer directly contacts the additional layer at a first location;
the additional layer directly contacts the first interconnect layer at a second location;
the fourth axis intersects the first and second locations; and
the fourth axis is between the second and third interconnect lines.

17. The system of claim 2 wherein:
the conformal layer includes silicon;
the conformal layer further includes at least one of nitrogen, oxygen, carbon, or combinations thereof.

18. The system of claim 1 wherein:
the additional layer includes silicon;
the additional layer further includes at least one of oxygen, nitrogen, carbon, or combinations thereof.

19. The system of claim 1 comprising:
an integrated circuit;
a memory; and
a package housing that includes the integrated circuit and the memory;
wherein one of the integrated circuit and the memory includes the first and second voids.

20. The system of claim 19 wherein the integrated circuit comprises a field programmable gate array (FPGA).

21. The system of claim 19 comprising:
a radiofrequency receiver; and
a chassis;
wherein the chassis includes the radiofrequency receiver and the package.

22. An integrated circuit system comprising:
first, second, and third interconnect wires included in a buildup layer;
a first void between the first and second interconnect wires and a second void between the second and third interconnect wires;
a conformal layer between the first and second interconnect wires; and
an additional layer between the first interconnect wire and a substrate that includes transistors;
wherein the first and second voids are hollow and include air;
wherein (a) a first axis intersects the first, second, and third interconnect wires and the first and second voids; (b) a second axis, orthogonal to the first axis, intersects the conformal layer and the additional layer; and (c) a third axis, orthogonal to the first axis, intersects the second interconnect wire and the additional layer;
wherein the conformal layer directly contacts the additional layer.

23. The system of claim 22 wherein:
the additional layer includes a metal;
the additional layer includes at least one of oxygen, nitrogen, carbon, or combinations thereof.

* * * * *